(12) United States Patent
Kobayashi

(10) Patent No.: US 9,674,468 B2
(45) Date of Patent: Jun. 6, 2017

(54) IMAGING DEVICE AND DRIVING METHOD FOR SOLID-STATE IMAGE SENSOR WITH MULTIPLE DIFFERENT ELECTRIC POTENTIALS

(75) Inventor: Hirokazu Kobayashi, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 596 days.

(21) Appl. No.: 13/511,908

(22) PCT Filed: Dec. 1, 2010

(86) PCT No.: PCT/JP2010/071945
§ 371 (c)(1),
(2), (4) Date: May 24, 2012

(87) PCT Pub. No.: WO2011/089791
PCT Pub. Date: Jul. 28, 2011

(65) Prior Publication Data
US 2012/0273657 A1  Nov. 1, 2012

(30) Foreign Application Priority Data
Jan. 19, 2010  (JP) .................................. 2010-009528

(51) Int. Cl.
| | |
|---|---|
| *H04N 5/359* | (2011.01) |
| *H04N 5/3745* | (2011.01) |
| *H01L 27/146* | (2006.01) |

(52) U.S. Cl.
CPC ..... *H04N 5/3591* (2013.01); *H01L 27/14609* (2013.01); *H04N 5/3745* (2013.01)

(58) Field of Classification Search
CPC ............... H04N 5/3591; H04N 5/3745; H04N 5/37455; H04N 5/374; H04N 5/3592;
(Continued)

(56) References Cited

U.S. PATENT DOCUMENTS 7,399,951 B2 *  7/2008  Morimoto et al. ......... 250/208.1
7,777,797 B2    8/2010  Ota .............................. 348/301
(Continued)

FOREIGN PATENT DOCUMENTS

| CN | 101124817 A | 2/2008 |
|---|---|---|
| CN | 101287064 A | 10/2008 |

(Continued)

OTHER PUBLICATIONS

Japan Patent Office, International Search Report mailed Jan. 11, 2011, in connection with International Application No. PCT/JP2010/071945 (2 pages).
(Continued)

*Primary Examiner* — Thanh Luu
*Assistant Examiner* — Jennifer Bennett
(74) *Attorney, Agent, or Firm* — Fitzpatrick, Cella, Harper & Scinto

(57) ABSTRACT

An imaging device comprises a solid-state image sensor including a plurality of unit pixels, and a driving unit. Each unit pixel includes a photo-electric converter that converts incident light into a signal charge, a holding unit that temporarily holds the signal charge obtained by the photo-electric converter, a first transfer gate arranged between the photo-electric converter and the holding unit, that transfers the signal charge to the holding unit, a charge-voltage converter that converts the signal charge into a voltage signal, and a second transfer gate arranged between the holding unit and the charge-voltage converter, that transfers the signal charge to the charge-voltage converter, and that is in a non-conductive state in the case where an image capturing operation is performed in the photo-electric converter. The driving unit drives the solid-state image sensor so as to supply three or more mutually different electric potentials to the first transfer gate.

8 Claims, 5 Drawing Sheets

(58) Field of Classification Search
CPC .... H04N 5/3595; H04N 5/353; H04N 5/3532; H01L 27/14609; H01L 27/14612; H01L 27/14643; H01L 27/146; H01L 27/14887
USPC ....... 250/208.1, 214 R, 206, 214.1; 348/241, 348/248, 296, 297, 298, 299, 300, 301, 348/302, 308; 257/257, 258, 290–292, 257/225, 229, 230
See application file for complete search history.

(56) References Cited

U.S. PATENT DOCUMENTS

| | | | |
|---|---|---|---|
| 7,990,440 B2 | 8/2011 | Kobayashi et al. | 348/241 |
| 8,284,282 B2 | 10/2012 | Oike | |
| 8,570,410 B2 | 10/2013 | Oike | |
| 2004/0051801 A1* | 3/2004 | Iizuka | H01L 27/14609 348/294 |
| 2006/0266922 A1* | 11/2006 | McGrath | H01L 27/14609 250/208.1 |
| 2008/0068479 A1 | 3/2008 | Ota | |
| 2008/0158401 A1 | 7/2008 | Ishimoto et al. | |
| 2008/0252742 A1 | 10/2008 | Oike | |
| 2011/0019045 A1* | 1/2011 | Lin | 348/296 |
| 2011/0278438 A1 | 11/2011 | Kobayashi | 250/214 |
| 2012/0175503 A1 | 7/2012 | Kuroda et al. | 250/214 A |
| 2012/0193690 A1 | 8/2012 | Inoue et al. | 257/290 |
| 2014/0015012 A1 | 1/2014 | Oike | |

FOREIGN PATENT DOCUMENTS

| | | |
|---|---|---|
| CN | 101562707 A | 10/2009 |
| JP | 9-163234 A | 6/1997 |
| JP | 10-093870 A | 4/1998 |
| JP | 2002-247456 A | 8/2002 |
| JP | 2006-246450 A | 9/2006 |
| JP | 2006-311515 A | 11/2006 |
| JP | 2007-124372 A | 5/2007 |
| JP | 2008-072046 A | 3/2008 |

OTHER PUBLICATIONS

Japan Patent Office, Written Opinion of the International Searching Authority mailed Jan. 11, 2011, in connection with International Application No. PCT/JP2010/071945 (3 pages).

Aug. 11, 2014 Chinese Office Action concerning corresponding Chinese Patent Application No. 201080061908.3.

* cited by examiner

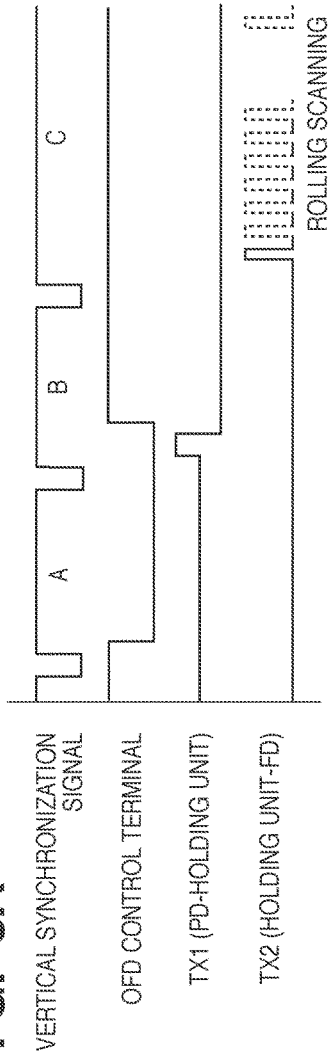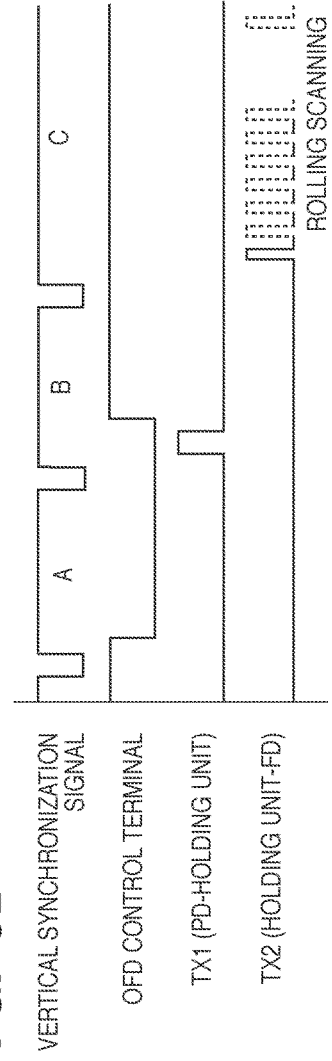

IMAGING DEVICE AND DRIVING METHOD FOR SOLID-STATE IMAGE SENSOR WITH MULTIPLE DIFFERENT ELECTRIC POTENTIALS

CROSS REFERENCE TO RELATED APPLICATIONS

The present application is a U.S. National Stage Entry of International Application No. PCT/JP2010/071945, filed Dec. 1, 2010, which claims priority to Japan Patent Application No. 2010-009528, filed Jan. 19, 2010. The entire disclosure of each prior application is incorporated herein by reference.

TECHNICAL FIELD

The present invention relates to technology for driving a CMOS solid-state image sensor.

BACKGROUND ART

Conventionally, when performing an electronic shutter operation in a CMOS solid-state image sensor, object distortion and the like have occurred due to rolling scanning. This object distortion may prominently occur when the relationship between the scan time per screen (e.g., 1/10 sec if the scan rate is 10 frames/sec) and the shutter speed (e.g., 1/60 sec) for capturing the moving speed of the object is as follows:

shutter speed<scan time per screen

For this reason, technology has been developed for reducing the scan time per screen, that is to say, improving the scan rate so as to prevent the occurrence of object distortion even at higher shutter speeds. Also, in a product in which a rise in cost is permissible, technology in which a mechanical shutter is used along with a CMOS solid-state image sensor is employed, and object distortion is reduced regardless of the scan time per screen by mechanically obstructing light before performing rolling scanning.

Meanwhile, with solid-state image sensors used in digital cameras, digital video cameras, and the like in recent years, the decrease in size and increase in number of pixels as well as the increase in ISO sensitivity have been progressing, and thus it can be said that amplified small signals from the image sensor are being used. Since noise occurs when a small signal is amplified, it is critical to reduce the occurrence of noise at the same time as the optical sensitivity of the solid-state image sensor is increased.

For example, Japanese Patent Laid-Open No. 2006-246450 discloses a solid-state imaging device and a driving method for the same that enable the addition of functions for, for example, full-screen simultaneous holding and an increase in dynamic range while maintaining the saturation charge amount, by separating the photodiode unit and the holding unit, and furthermore providing the holding unit with leeway in terms of surface area. As shown in FIG. 5, a photodiode PD is connected to a holding unit Mem via a first transfer gate TX1, and a signal charge generated by the photodiode PD is transferred to the holding unit Mem from the start of the exposure period. In signal readout performed after the end of exposure, the signal is transferred from the holding unit Mem to a floating diffusion unit FD via a second transfer gate TX2, and thereafter rolling scanning is performed, which is unique to CMOS solid-state imaging devices. On the other hand, although the photodiode PD is exposed during the rolling scanning as well, the first transfer gate TX1 has been closed. Furthermore, the generated charge is constantly being output to an overflow drain OFD, and therefore there is no influence on the original signal charge in the holding unit Mem. In other words, although the signal readout scanning is rolling scanning, all of the pixels in the screen are controlled simultaneously by the first transfer gate TX1 from the start to the end of the actual holding of the signal charge, thus enabling full-screen simultaneous holding to be performed in principle.

With the above-described configuration, even if the surface area of the photodiode PD is relatively small, there is no particular influence on the photo-electric conversion characteristics if the efficiency with which light is condensed on the photodiode is improved. Instead, it has become possible to increase the surface area of the holding unit Mem, and maintain the saturation charge amount while transferring the signal charge from the start of the exposure period.

Meanwhile, a configuration of a solid-state image sensor is known in which the dark current component is reduced by controlling the potential below the gate electrode of a transfer MOS transistor, thus achieving a hole storage state (see Japanese Patent Laid-Open No. 2002-247456, for example).

However, with the technology disclosed in the above-described Japanese Patent Laid-Open No. 2006-246450, a buried channel of the transfer MOS transistor between the photodiode PD and the holding unit Mem serves as a countermeasure for an increase in dark current that occurs due to the continuous rise in the channel potential of the transfer MOS transistor during exposure. Therefore, this requires advanced manufacturing technology.

SUMMARY OF INVENTION

The present invention has been achieved in light of the aforementioned issues, and according to the present invention, in a solid-state image sensor that enables the addition of functions for, for example, full-screen simultaneous holding and an increase in dynamic range while maintaining the saturation charge amount, an increase in dark current during exposure is reduced without requiring advanced manufacturing technology.

According to a first aspect of the present invention, an imaging device includes: a solid-state image sensor including a plurality of unit pixels, each including a photo-electric converter that converts incident light into a signal charge, a holding unit that temporarily holds the signal charge obtained by the photo-electric converter, a first transfer gate arranged between the photo-electric converter and the holding unit, that transfers the signal charge to the holding unit, a charge-voltage converter that converts the signal charge into a voltage signal, and a second transfer gate arranged between the holding unit and the charge-voltage converter, that transfers the signal charge to the charge-voltage converter, and that is in a non-conductive state in a case where an image capturing operation is performed in the photo-electric converter; and a driving unit that drives the solid-state image sensor so as to supply three or more mutually different electric potentials to the first transfer gate.

Also, a driving method for a solid-state image sensor according to a second aspect of the present invention is a driving method for a solid-state imaging sensor including a plurality of unit pixels, each including a photo-electric converter that converts incident light into a signal charge, a holding unit that temporarily holds the signal charge obtained by the photo-electric converter, a first transfer gate arranged between the photo-electric converter and the holding unit, that transfers the signal charge to the holding unit, a charge-voltage converter that converts the signal charge into a voltage signal, and a second transfer gate arranged between the holding unit and the charge-voltage converter, that transfers the signal charge to the charge-voltage converter, and that is in a non-conductive state in a case where an image capturing operation is performed in the photo-electric converter. The method includes a step of changing the electric potential of the first transfer gate among three or more mutually different electric potentials.

Further features of the present invention will become apparent from the following description of exemplary embodiments with reference to the attached drawings.

BRIEF DESCRIPTION OF DRAWINGS

FIGS. 3A and 3B are timing charts showing driving methods for the solid-state image sensor according to Embodiments 1 and 2 respectively.

DESCRIPTION OF EMBODIMENTS

Figure 1:
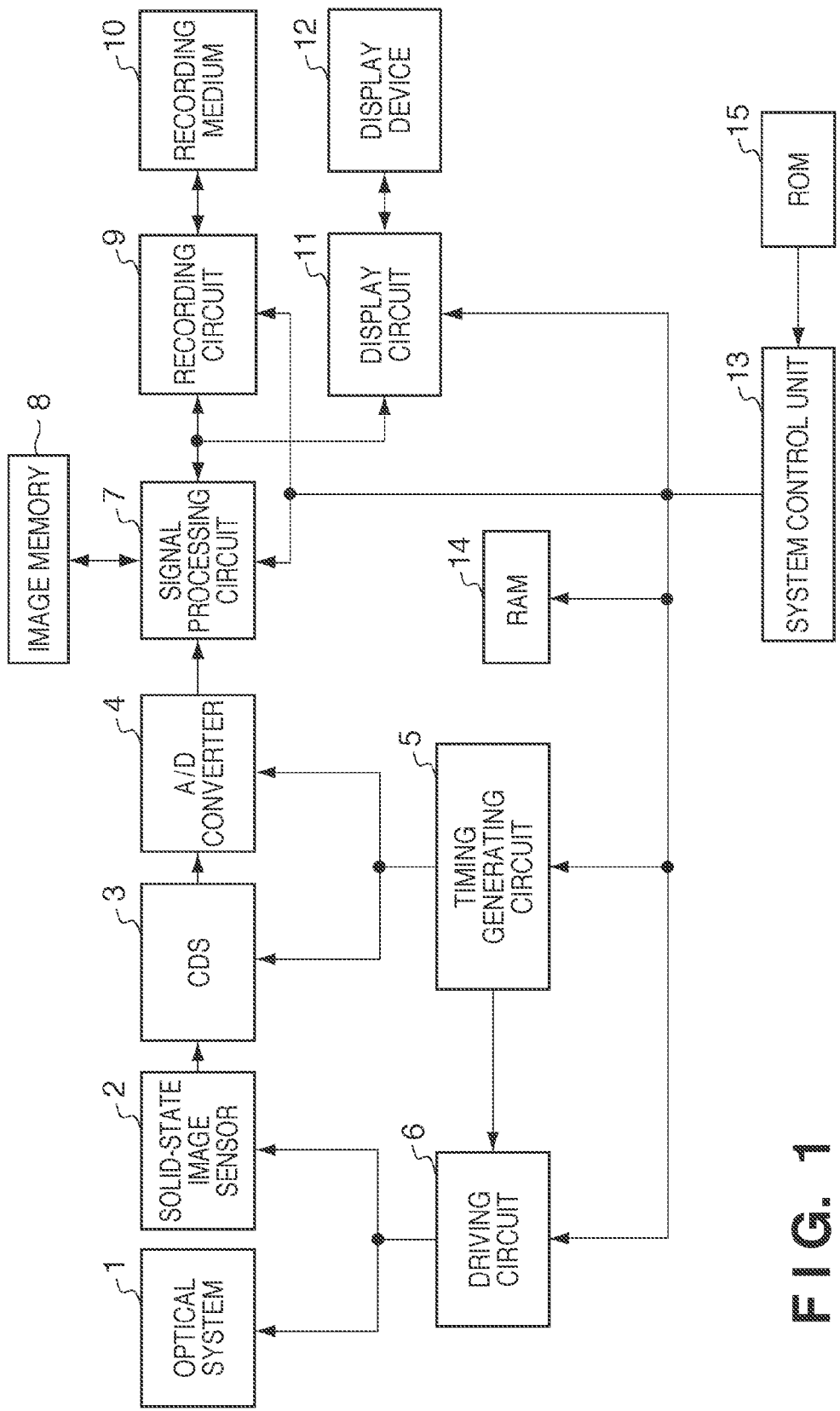
FIG. 1 is a diagram showing a configuration of an imaging device common to Embodiments 1 and 2 of the present invention.

FIG. 1 is a diagram showing a configuration of an imaging device common to Embodiments 1 and 2 of the present invention. In FIG. 1, reference numeral 1 denotes an optical system including a lens having an aperture and the like, and reference numeral 2 denotes a solid-state image sensor that performs photo-electric conversion on an object image formed by the optical system 1 so as to generate an electrical signal. In the case where the solid-state image sensor 2 is a CMOS solid-state image sensor that performs rolling scanning, there is technology in which, as previously mentioned, a mechanical shutter is arranged between the optical system 1 and the solid-state image sensor 2, and object distortion is reduced by obstructing light in conformity with the end of exposure. However, in the embodiments of the present invention, such a mechanical shutter is not essential. This is because, as will be described later, the solid-state image sensor 2 is structured so as to include a holding unit Mem, and therefore object distortion does not occur in principle, even without a mechanical shutter. Reference numeral 3 denotes a correlated double sampling (CDS) circuit for sampling an analog electrical signal from the solid-state image sensor 2, and reference numeral 4 denotes an A/D converter for converting the sampled analog signal into a digital signal. The digitized image signal is held in an image memory 8, then subjected to various types of signal processing such as white balance correction and gamma correction by a signal processing circuit 7, and the resultant image signal is recorded in a recording medium 10. A recording circuit 9 is an interface circuit for interfacing with the recording medium 10. The image signal subjected to signal processing can also be directly displayed by a display device 12 such as a liquid crystal display via a display circuit 11, which is an interface circuit.

A timing generating circuit 5 drives, via a driving circuit 6, the imaging systems such as the aperture of the optical system 1, the solid-state image sensor 2, and the like. The timing generating circuit 5 also drives and controls the correlated double sampling circuit 3 and the A/D converter 4 in synchronization with the driving of the imaging systems, that is to say, the output signal of the solid-state image sensor 2. The driving methods for the imaging device of the embodiments of the present invention have a characteristic feature regarding the driving of the imaging systems, which is performed by the timing generating circuit 5 via the driving circuit 6.

A system control unit 13 performs overall control of the imaging device in accordance with a program temporarily stored in a volatile memory 14. A switching signal used in the driving method according to Embodiment 2, which will be described later, is generated by the system control unit 13 and transmitted to the timing generating circuit 5. Reference numeral 15 denotes a non-volatile memory that stores programs and various types of data that are to be transferred when control is executed.

Figure 2:
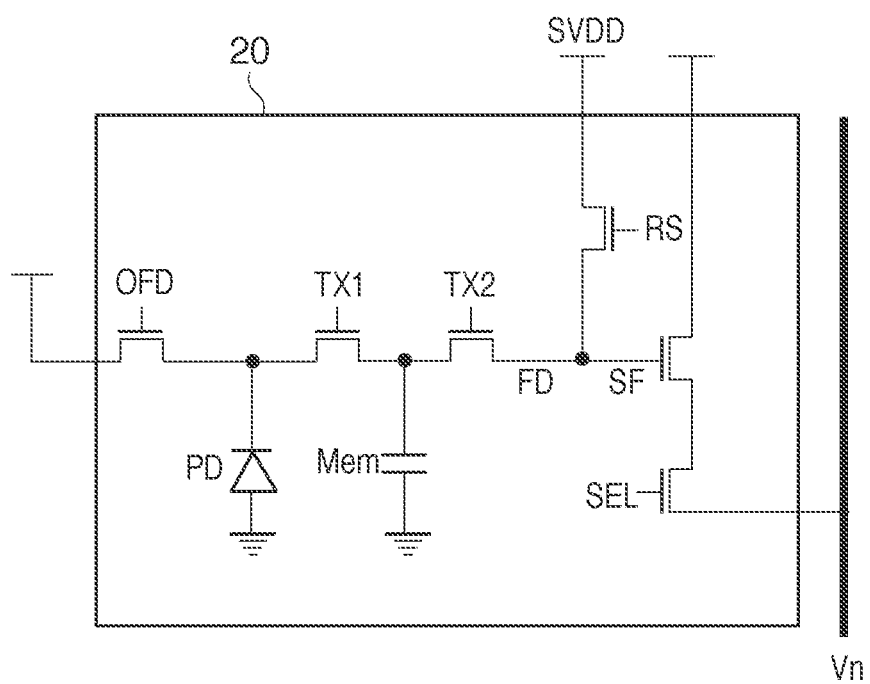
FIG. 2 is an equivalent circuit diagram showing a unit pixel of a solid-state image sensor.

FIG. 2 is an equivalent circuit diagram showing a unit pixel of the solid-state image sensor 2 used in the imaging device of the embodiments of the present invention. Although not shown, the solid-state image sensor 2 includes a plurality of unit pixel structures 20 that are arranged horizontally and vertically; a vertical scan circuit, a horizontal scan circuit, and the later-described driving methods are realized by these. Also, it is commonly known that, for example, each unit pixel structure 20 is connected to one of vertical output lines Vn (hereinafter, n indicates the column number of the vertical output line) that are provided one for each vertical column and are lined up in the horizontal direction, in common with other unit pixels provided for each horizontal row in the vertical direction, and scanning (i.e., rolling scanning) is performed over one horizontal row at a time. Note that here, each of the unit pixel structures 20 includes a floating diffusion unit FD, an amplification MOS transistor SF, a reset MOS transistor RS, and a selection MOS transistor SEL. However, a structure in which these units are shared by adjacent or neighboring pixels can also be employed.

Next is a description of the functions and details of the units of the unit pixel structures 20. A photodiode PD is a photo-electric converter that converts incident light into a signal charge. An overflow drain OFD has the function of outputting, if necessary, all or some of the charge generated by the photodiode PD. A detailed description of the actual control method will be given along with the driving methods according to Embodiments 1 and 2, which will be described later. Note that the overflow drain OFD may be a vertical overflow drain or a lateral overflow drain, and the control terminal thereof may be connected to a drain power supply, or be configured so as to receive an application of a potential from the gate with the photodiode PD as shown in FIG. 2.

The holding unit Mem is connected to the photodiode PD via a first transfer gate TX1, and furthermore the floating diffusion unit FD is connected to the holding unit Mem via a second transfer gate TX2. Specifically, when reading out the signal charge generated by the photodiode PD as a legitimate signal, the signal charge is temporarily held in the holding unit Mem, and thereafter transferred to the floating diffusion unit FD. Note that the floating diffusion unit FD is a charge-voltage converter that converts a signal charge into a voltage signal. A detailed description of the actual control method will be given along with the driving methods according to Embodiments 1 and 2, which will be described later. Note that the holding unit Mem is shielded from light so as to not sense light even if light is not obstructed by a mechanical shutter. Here, the first transfer gate TX1 or the second transfer gate TX2 may have an electrode configuration that also serves as a structure for shielding the holding unit Mem from light.

In order to read out changes in the electric potential of the floating diffusion unit FD as a legitimate signal, normally the reset electric potential of the floating diffusion unit FD is read out prior to such readout. The reset MOS transistor RS is used to write a reset electric potential SVDD to the floating diffusion unit FD. When reading out the signal electric potential and the reset electric potential, the amplification MOS transistor SF configures a source follower circuit due to the start of operation of the selection MOS transistor SEL and a constant current source of the vertical output lines Vn, thus enabling the change in electric potential to be transferred. The above method for reading out the change in electric potential is not unique to the present invention, and a detailed description thereof has been omitted from the Embodiments 1 and 2 described below, since various types of methods have been proposed in conformity with the downstream structure of the vertical output lines Vn.

Embodiment 1

Below is a description of a driving method for a solid-state image sensor of Embodiment 1 of the present invention with reference to the timing chart in FIG. 3A. In FIG. 3A, transitions between three states called "exposure" (indicated by A), "batch transfer" (indicated by B), and "readout" (indicated by C) are performed in accordance with a vertical synchronization signal. The state called "exposure" is the start of the actual exposure period due to the first polarity change (falling edge) of the OFD control terminal shown in the figure. The state called "batch transfer" is the end of the actual exposure period due to the first polarity change (rising edge) of the first transfer gate TX1 shown in the figure. Changing the polarity of the OFD control terminal and the first transfer gate TX1 at once for all of the pixels in the imaging region enables full-screen simultaneous holding to be performed, and object distortion does not occur in principle. The state called "readout" is a state in which the charge held in the light-shielded holding units Mem in the unit pixels is readout by the so-called rolling scanning. Rolling scanning is performed by, for example, sequentially opening the second transfer gates TX2 row-by-row (the polarity changes shown by solid lines in the figure representing control performed on the second transfer gates TX2 of the unit pixels in the first row, for example, and the polarity changes shown by broken lines representing control performed on the second transfer gates TX2 of the unit pixels in the subsequent rows), but object distortion and the like does not occur since the actual exposure period ends in the batch transfer state. Note that in at least this readout state, the OFD control terminal is in an unnecessary charge output state after the second polarity change in the figure, which is the same as the state before the actual exposure period, thus enabling reducing a phenomenon in which, for example, charge generated by the photodiode PD leaks into the holding unit.

Next is a detailed description of control of the first transfer gate TX1. Firstly, throughout the actual exposure period (and it can be said before this period as well), the first transfer gate TX1 receives a supply of a first electric potential that is lower than the highest electric potential in the figure, which accompanies the aforementioned batch transfer, and is higher than the lowest electric potential in the figure, which is after the end of batch transfer (after the falling edge). Preferably, the first electric potential is set as low as possible, while also causing the potential barrier of the first transfer gate formed by the first electric potential to be lower than the potential barrier on the overflow drain side (OFD side). As a result of doing this, a state relatively closer to the later-described hole storage state than the depleted layer state during batch transfer is maintained below the gate electrode of the first transfer gate TX1, thus enabling reducing the probability of generation of dark current and scratches. Meanwhile, it is also possible to reduce the phenomenon in which charge is lost due to the legitimate signal charge obtained by photo-electric conversion performed by the photodiode PD in the actual exposure period leaking to the overflow drain OFD side (can also be said to be a reduction in saturation charge amount). Next, in order to perform batch transfer of signal charge from the photodiodes PD to the holding units Mem, a second electric potential, which is the highest in the figure, is supplied to the first transfer gate TX1. This electric potential is for causing complete transfer of the signal charge from the photodiodes PD, and determines the end of the actual exposure period. In general, the second electric potential is supplied having a pulse shape with a shorter period compared to the actual exposure period and the rolling scanning time. After the batch transfer has ended, a third electric potential for achieving the hole storage state below the gate electrode of the first transfer gate TX1 is supplied. After the end of the actual exposure period, the charge generated by the photodiode PD is output to the overflow drain OFD side, and therefore the third electric potential, which is an electric potential lower than the first electric potential, can achieve the hole storage state below the transfer gate electrode.

Embodiment 2

Below is a description of a driving method of Embodiment 2 of the present invention with reference to the timing chart in FIG. 3B and the flowchart in FIG. 4. In Embodiment 1, both maintenance of saturation charge amount and a reduction in the probability of generation of dark current and scratches in the actual exposure period are achieved while keeping a balance therebetween, by changing the electric potential of the first transfer gate TX1 among three electric potentials. Incidentally, in a high ISO sensitivity situation or a low brightness situation in which the saturation charge amount is not very high, or the like, problems such as blocked up highlights (saturation deficit) do not readily occur even when the electric potential is set such that the hole storage state is achieved below the gate electrode of the first transfer gate TX1 in the actual exposure period as well. Embodiment 2 focuses on this property.

Figure 4:
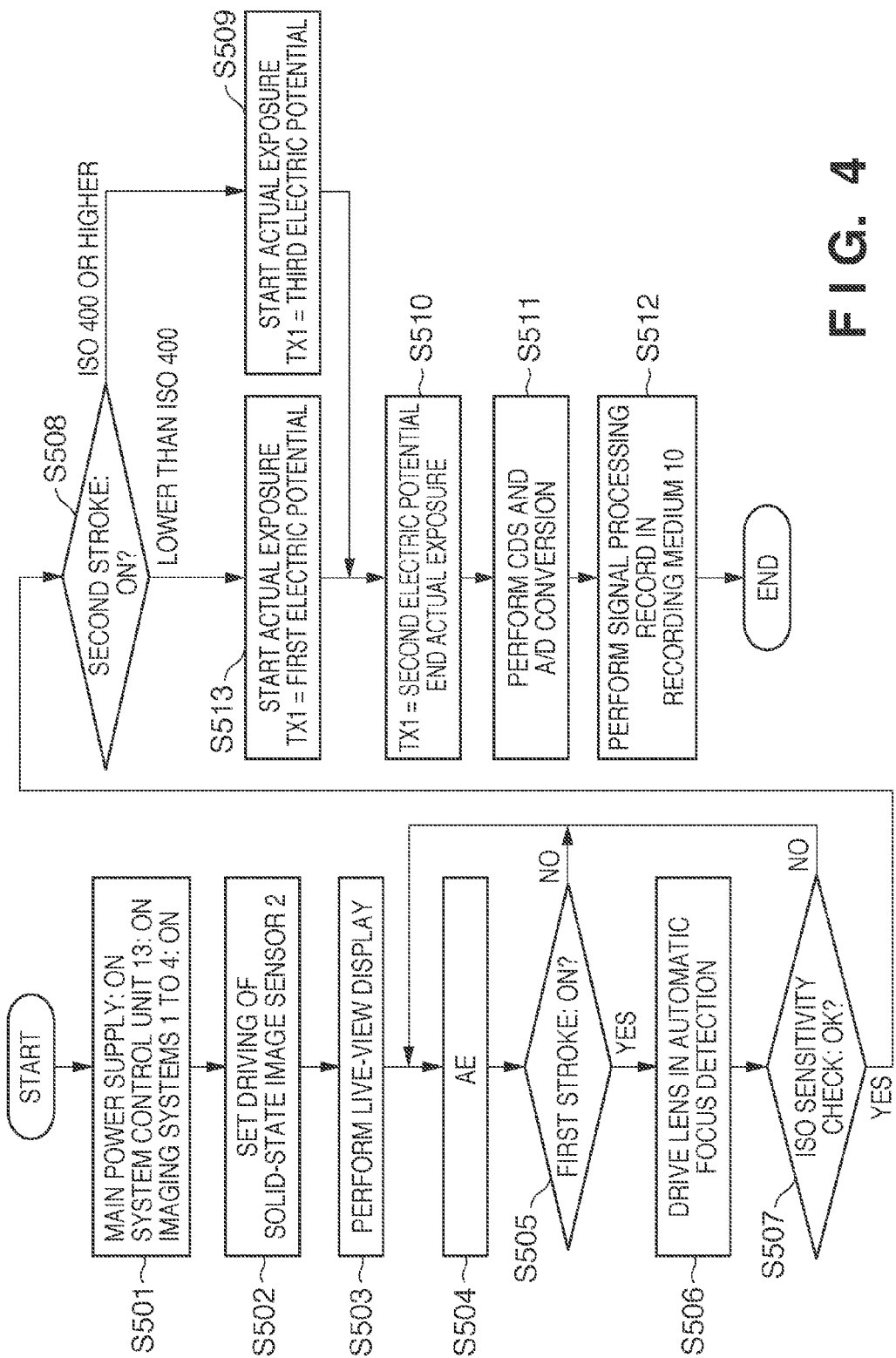
FIG. 4 is a flowchart showing operations of the imaging device according to Embodiment 2.
Figure 5:
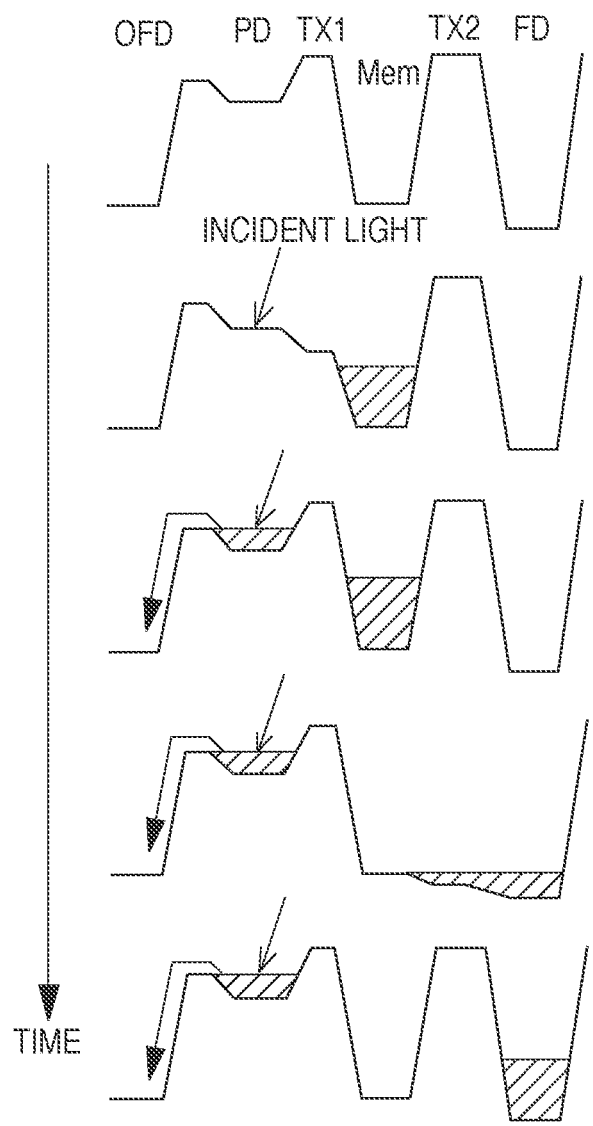
FIG. 5 is a diagram showing electric potential in a conventional driving method for a solid-state image sensor.

First is a description of a control method shown in FIG. 4 in the order of the steps. Firstly, a main power supply is turned on by a switch not shown in FIG. 1, then the power supply of the control system is turned on, and furthermore the power supply of the imaging systems is turned on (step S501). Next, a driving setting signal is applied to the solid-state image sensor 2 (step S502), thus enabling live-view display (step S503).

In order to control the exposure amount prior to imaging, the system control unit 13 causes a digitized image signal to be transmitted from the imaging systems to the image memory 8, and causes the signal processing circuit 7 to perform an exposure calculation. How many levels the brightness needs to be increased (or decreased) compared to the current situation is calculated by performing the following weighted calculation for each area of the screen on, for example, the luminance information extracted from the image signal:

$Y = a \times R + b \times G + c \times B \ (a+b+c=1)$

The system control unit 13 receives the result of this calculation, and obtains an image having the appropriate brightness beginning from the next frame by driving the aperture of the optical system 1. If the solid-state image sensor has an electronic shutter function, the shutter speed may be changed at the same time. The exposure calculation may be performed using a feedback method such as that described above, and it is possible to use a feed-forward method in which control is performed based on the appropriate aperture value and shutter speed directly obtained from a signal from an exposure measurement sensor (not shown in FIG. 1) provided separately from the imaging systems.

In the flowchart in FIG. 4, processing from the exposure amount calculation to the exposure determination is called AE (Auto Exposure), and is shown in step S504. Next, automatic focus detection is performed. The imaging device includes a shutter release button (not shown in FIG. 1) that has two levels of stroke, and using the first stroke as a trigger (step S505), a focusing lens of the optical system 1 is driven a plurality of steps, and image signals of a plurality of images are obtained. The calculation processing is performed on each of the image signals, and the position of the focusing lens having optimal focus is determined. The system control unit 13 receives the result of this detection, and obtains an image having optimal focus beginning from the next frame by driving the focusing lens of the optical system 1.

In the automatic focus detection as well, a method may be employed in which an object distance is directly measured from a signal from a ranging sensor (not shown in FIG. 1) provided separately from the imaging systems, and the focusing lens is driven based on the object distance. In the flowchart in FIG. 4, processing from focus detection to lens driving is called "automatic focus detection", and is shown in step S506.

After the appropriate exposure and focus have been confirmed as described above, actual imaging is started using the second stroke of the shutter release button as a trigger (step S508). In this case, the gain (ISO sensitivity setting) necessary in actual imaging is checked (step S507), and if a determination has been made that the saturation charge amount is relatively high, control is performed such that the electric potential of the first transfer gate TX1 up to the end of the actual exposure period is the first electric potential (step S513), similarly to Embodiment 1. Note that although an ISO sensitivity setting of ISO 400 (predetermined gain) or less is determined if the saturation charge amount is relatively high in FIG. 4, it is sufficient to design an optimal value on a case-by-case basis taking into consideration, for example, the surface area ratio between the photodiode and the holding unit in the unit pixel structures 20 of the solid-state image sensor 2. If a determination has been made that the saturation charge amount is relatively low (in the case of "higher than ISO400" in FIG. 4), control is performed such that the electric potential of the first transfer gate TX1 up to the end of the actual exposure period is the third electric potential, which is equal to the electric potential after the end of batch transfer (step S509). In the latter exposure method, there are cases where the potential barrier formed by the first transfer gate TX1 becomes higher than that on the overflow drain OFD side, and therefore the saturation charge amount is merely substantially equal to the capacitance of the photodiode PD. However, since the hole storage state can be achieved below the gate electrode of the first transfer gate TX1, there is a considerable effect of reducing the probability of occurrence of dark current and scratches during exposure.

Next, the gate of the first transfer gate TX1 is opened by supplying the second electric potential thereto, the signal charge of the photodiode PD is transferred to the holding unit Mem, and the actual exposure period ends (step S510). The electric potential supplied to the first transfer gate TX1 in this step is not dependent on the saturation charge amount (ISO sensitivity setting or the like) that is necessary.

Although a method of monitoring the state of an ISO sensitivity setting dial is employed in the flowchart in FIG. 4, even in the case where an automatic ISO sensitivity setting mode for setting the ISO sensitivity according to the scene has been set, it is possible to select and set a driving method in accordance with the determined ISO sensitivity.

The A/D converter 4 performs A/D conversion on the image signal output from the solid-state image sensor 2, and the resultant image signal is temporarily stored in the image memory 8 (step S511). After the aforementioned various types of signal processing have been performed by the signal processing circuit 7, the resultant image signal is recorded in the recording medium 10 via the recording circuit 9, and thus the series of image capturing operations is complete (step S512).

According to the present embodiment, a configuration is possible in which an electric potential that achieves a hole storage state below the gate electrode of the first transfer gate TX1 is supplied when the ISO sensitivity is high, thus improving the effect of reducing the probability of occurrence of dark current and scratches in scenes where dark current and scratches are particularly noticeable in an image.

Incidentally, causes for the decrease in saturation charge amount that occurs when achieving the hole storage state below the gate electrode of the first transfer gate TX1 in the actual exposure period are not only the surface area of the photodiode PD, but also the height of the potential barrier on the overflow drain side (OFD side). Below is a description of the driving method in FIG. 3B with further attention on this property.

The electric potential of the first transfer gate TX1 up to the end of the actual exposure period is an electric potential that achieves the hole storage state below the gate electrode. Meanwhile, firstly a low electric potential is supplied to the OFD control terminal up to the end of the actual exposure period. This low electric potential is set as low as possible, while also causing the potential barrier on the overflow drain OFD side formed by the low electric potential to be lower than that of the potential barrier of the first transfer gate. Doing this enables comparatively reducing the phenomenon in which charge is lost due to the legitimate signal charge obtained by photo-electric conversion performed by the photodiode PD in the actual exposure period leaking to the overflow drain OFD side (can also be said to be a reduction in saturation charge amount). Next, batch transfer is performed with use of the first transfer gates TX1 that determine the end of the actual exposure period. After the end of the actual exposure period, the highest electric potential in the figure is supplied to the OFD control terminal, thus achieving the unnecessary charge output state, similarly to Embodiment 1.

According to the present embodiment, since the saturation charge amount is relatively improved, the electric potential that achieves the hole storage state below the gate electrode of the first transfer gate TX1 up to the end of the actual exposure period can be, for example, used at a lower ISO sensitivity.

Although preferred embodiments of the present invention have been described above, the present invention is not limited to these embodiments, and various modifications can be made without departing from the spirit of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An imaging device comprising:
a solid-state image sensor including a plurality of unit pixels, each including
a photo-electric converter that converts incident light into a signal charge,
a holding unit that temporarily holds the signal charge obtained by the photo-electric converter,
a first transfer gate arranged between the photo-electric converter and the holding unit, that transfers the signal charge to the holding unit,
a charge-voltage converter that converts the signal charge into a voltage signal,
a second transfer gate arranged between the holding unit and the charge-voltage converter, that transfers the signal charge to the charge-voltage converter, and that is in a non-conductive state in a case where an image capturing operation is performed in the photo-electric converter, and
an overflow drain that discharges signal charge converted by the photo-electric converter; and
a driving unit that drives the solid-state image sensor,
wherein the driving unit supplies, within an exposure period of the photo-electric converter, a first electric potential to the first transfer gate,
wherein the driving unit supplies, within a transfer period during which batch transfer in which the signal charge is collectively transferred from the photo-electric converter to the holding unit is performed after the end of the exposure period, a second electric potential, which is higher than the first electric potential, to the first transfer gate,
wherein the driving unit supplies, within a period after the end of the transfer period, a third electric potential, which is lower than the first electric potential, to the first transfer gate,
wherein the driving unit performs control such that, at least during a period from the exposure period to the end of the transfer period, the potential barrier of the overflow drain side becomes higher than that of the first transfer gate side, and such that, after the third electric potential is supplied to the first transfer gate, the potential barrier of the overflow drain side becomes lower than that of the first transfer gate side, and
wherein the driving unit further supplies, at least during a period from the start of the exposure period until after the end of the transfer period, a fixed electric potential to the second transfer gate that heightens a potential barrier of the second transfer gate.

2. The imaging device according to claim 1, wherein the third electric potential is an electric potential at which a hole storage state is achieved below an electrode of the first transfer gate.

3. The imaging device according to claim 1, wherein in a case where a gain in amplification of an output signal of the solid-state image sensor is higher than a predetermined gain, the driving unit supplies, as the first electric potential, an electric potential that is equivalent to the third electric potential to the first transfer gate.

4. A driving method for a solid-state image sensor including a plurality of unit pixels each including:
a photo-electric converter that converts incident light into a signal charge,
a holding unit that temporarily holds the signal charge obtained by the photo-electric converter,
a first transfer gate arranged between the photo-electric converter and the holding unit, that transfers the signal charge to the holding unit,
a charge-voltage converter that converts the signal charge into a voltage signal,
a second transfer gate arranged between the holding unit and the charge-voltage converter, that transfers the signal charge to the charge-voltage converter, and that is in a non-conductive state in a case where an image capturing operation is performed in the photo-electric converter, and
an overflow drain that discharges signal charge converted by the photo-electric converter,
the method comprising:
supplying, within an exposure period of the photo-electric converter, a first electric potential to the first transfer gate,
supplying, within a transfer period during which batch transfer in which the signal charge is collectively transferred from the photo-electric converter to the holding unit is performed after the end of the exposure period, a second electric potential, which is higher than the first electric potential, to the first transfer gate,
supplying, within a period after the end of the transfer period, a third electric potential, which is lower than the first electric potential, to the first transfer gate,
controlling such that, at least during a period from the exposure period to the end of the transfer period, the potential barrier of the overflow drain side becomes higher than that of the first transfer gate side, and such that, after the third electric potential is supplied to the first transfer gate, the potential barrier of the overflow drain side becomes lower than that of the first transfer gate side, and
controlling, at least during a period from the start of the exposure period until after the end of the transfer period, to supply a fixed electric potential to the second transfer gate that heightens a potential barrier of the second transfer gate.

5. An imaging device comprising:
a solid-state image sensor including a plurality of unit pixels, each including:
a photo-electric converter that converts incident light into a signal charge,
a holding unit that temporarily holds the signal charge obtained by the photo-electric converter,
a first transfer gate arranged between the photo-electric converter and the holding unit, that transfers the signal charge to the holding unit,
a charge-voltage converter that converts the signal charge into a voltage signal,
a second transfer gate arranged between the holding unit and the charge-voltage converter, that transfers the signal charge to the charge-voltage converter, and that is in a non-conductive state in a case where an image capturing operation is performed in the photo-electric converter, and an overflow drain that discharges signal charge converted by the photo-electric converter; and
a driving unit that drives the solid-state image sensor,
wherein the driving unit supplies, within an exposure period of the photo-electric converter, a first electric potential to the first transfer gate,
wherein the driving unit supplies, within a transfer period during which batch transfer in which the signal charge is collectively transferred from the photo-electric converter to the holding unit is performed after the end of the exposure period, a second electric potential, which is higher than the first electric potential, to the first transfer gate,
wherein the driving unit supplies, within a period after the end of the transfer period, a third electric potential, which is lower than the first electric potential, to the first transfer gate,
wherein the driving unit performs controls such that, at least during a period from the exposure period to the end of the transfer period, the potential barrier of the overflow drain side becomes higher than that of the first transfer gate side, and such that, in a period after the transfer period is completed, the potential barrier of the overflow drain side becomes lower than that of the first transfer gate side,
wherein the driving unit further supplies, at least during a period from the start of the exposure period until after the end of the transfer period, a fixed electric potential to the second transfer gate that heightens a potential barrier of the second transfer gate, and
wherein the driving unit transfers, within a reading period, the signal charge from the holding unit to the charge-voltage converter by sequentially supplying an electric potential, which makes a potential barrier of the second transfer gate lower, to the second transfer gate in every reading row, and controls to read out a voltage signal by converting the signal charge to the voltage signal.

6. The imaging device according to claim 5, wherein the third electric potential is an electric potential at which a hole storage state is achieved below an electrode of the first transfer gate.

7. The imaging device according to claim 5, wherein in a case where a gain in amplification of an output signal of the solid-state image sensor is higher than a predetermined gain, the driving unit supplies, as the first electric potential, an electric potential that is equivalent to the third electric potential to the first transfer gate.

8. A driving method for a solid-state image sensor including a plurality of unit pixels each including:
a photo-electric converter that converts incident light into a signal charge,
a holding unit that temporarily holds the signal charge obtained by the photo-electric converter,
a first transfer gate arranged between the photo-electric converter and the holding unit, that transfers the signal charge to the holding unit,
a charge-voltage converter that converts the signal charge into a voltage signal,
a second transfer gate arranged between the holding unit and the charge-voltage converter, that transfers the signal charge to the charge-voltage converter, and that is in a non-conductive state in a case where an image capturing operation is performed in the photo-electric converter, and
an overflow drain that discharges signal charge converted by the photo-electric converter,
the method comprising:
supplying, within an exposure period of the photo-electric converter, a first electric potential to the first transfer gate,
supplying, within a transfer period during which batch transfer in which the signal charge is collectively transferred from the photo-electric converter to the holding unit is performed after the end of the exposure period, a second electric potential, which is higher than the first electric potential, to the first transfer gate,
supplying, within a period after the end of the transfer period, a third electric potential, which is lower than the first electric potential, to the first transfer gate,
controlling such that, at least during a period from the exposure period to the end of the transfer period, the potential barrier of the overflow drain side becomes higher than that of the first transfer gate side, and such that, in a period after the transfer period is completed, the potential barrier of the overflow drain side becomes lower than that of the first transfer gate side,
controlling, at least during a period from the start of the exposure period until after the end of the transfer period, to supply a fixed electric potential to the second transfer gate that heightens a potential barrier of the second transfer gate, and
controlling, within a reading period, to transfer the signal charge from the holding unit to the charge-voltage converter by sequentially supplying an electric potential, which makes a potential barrier of the second transfer gate lower, to the second transfer gate in every reading row, and controlling to read out a voltage signal by converting the signal charge to the voltage signal.

* * * * *